United States Patent
Yun et al.

(10) Patent No.: US 8,044,506 B2
(45) Date of Patent: Oct. 25, 2011

(54) THERMAL-EMITTING MEMORY MODULE, THERMAL-EMITTING MODULE SOCKET, AND COMPUTER SYSTEM

(75) Inventors: Young Yun, Yongin-si (KR); Soo-Kyung Kim, Seoul (KR); Kwang-Seop Kim, Yongin-si (KR); Ki-Hyun Ko, Yongin-si (KR); Sung-Joo Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 483 days.

(21) Appl. No.: 12/181,488

(22) Filed: Jul. 29, 2008

(65) Prior Publication Data
US 2009/0034327 A1   Feb. 5, 2009

(30) Foreign Application Priority Data
Jul. 31, 2007   (KR) .................. 10-2007-0076955

(51) Int. Cl.
*H01L 23/34*   (2006.01)

(52) U.S. Cl. ............... 257/714; 257/713; 257/E31.131; 257/E23.088; 257/E23.097; 257/E23.098; 361/679.47; 174/15.1; 174/15.2

(58) Field of Classification Search .......... 257/678–734, 257/796, 276, 625, 675, E33.075, E31.131, 257/E3.051, E23.08–E23.113; 361/679.46, 361/679.47, 679.52, 709; 165/75, 110, 157; 174/15.1, 15.2, 20
See application file for complete search history.

(56) References Cited

U.S. PATENT DOCUMENTS
| | | | |
|---|---|---|---|
| 5,239,200 A * | 8/1993 | Messina et al. | ............... 257/714 |
| 2002/0053726 A1* | 5/2002 | Mikubo et al. | ............... 257/685 |
| 2006/0012956 A1 | 1/2006 | Hornung et al. | |

FOREIGN PATENT DOCUMENTS
| | | |
|---|---|---|
| JP | 06132687 | 5/1994 |
| KR | 1020010040123 A | 5/2001 |

* cited by examiner

*Primary Examiner* — Jasmine Clark
(74) *Attorney, Agent, or Firm* — Volentine & Whitt, PLLC

(57) ABSTRACT

The invention provides a thermal-emitting memory module, a thermal-emitting module socket, and a computer system comprising the thermal-emitting memory module and the thermal-emitting module socket. An embodiment of the thermal-emitting module includes: a module substrate having electrically-conductive traces; and a semiconductor device disposed on the module substrate and coupled to the electrically-conductive traces, the module substrate including a thermal-emitting portion disposed in proximity of the semiconductor device without directly contacting the semiconductor device.

16 Claims, 10 Drawing Sheets

THERMAL-EMITTING MEMORY MODULE, THERMAL-EMITTING MODULE SOCKET, AND COMPUTER SYSTEM

CROSS-REFERENCE TO RELATED APPLICATION

This patent application claims priority from Korean Patent Application No. 10-2007-0076955, filed Jul. 31, 2007, the contents of which are hereby incorporated by reference in their entirety.

SUMMARY OF THE INVENTION

The invention relates generally to electronic packaging that is configured for thermal management. Embodiments of the invention provide a thermal-emitting memory module, a thermal-emitting module socket, and a computer system that includes a thermal-emitting memory module and a thermal-emitting module socket.

One aspect of the invention provides a thermal-emitting module that includes: a module substrate having electrically-conductive traces; and a semiconductor device disposed on the module substrate and coupled to the electrically-conductive traces, the module substrate including a thermal-emitting portion disposed in proximity of the semiconductor device without directly contacting the semiconductor device.

Another aspect of the invention provides a thermal-emitting module socket configured to couple to a thermal-emitting module, the thermal-emitting module socket comprising a socket body. The socket body includes: a connecting portion; and a fluid storing portion, the socket body having a plurality of openings to an interior of the fluid storing portion.

Yet another aspect of the invention provides computer system that includes the thermal-emitting module and the thermal-emitting module socket.

BRIEF DESCRIPTION OF THE DRAWINGS

The above and other features of the invention will be described in reference to certain exemplary embodiments thereof with reference to the attached drawings in which.

DETAILED DESCRIPTION OF THE EMBODIMENTS

Figure 1:
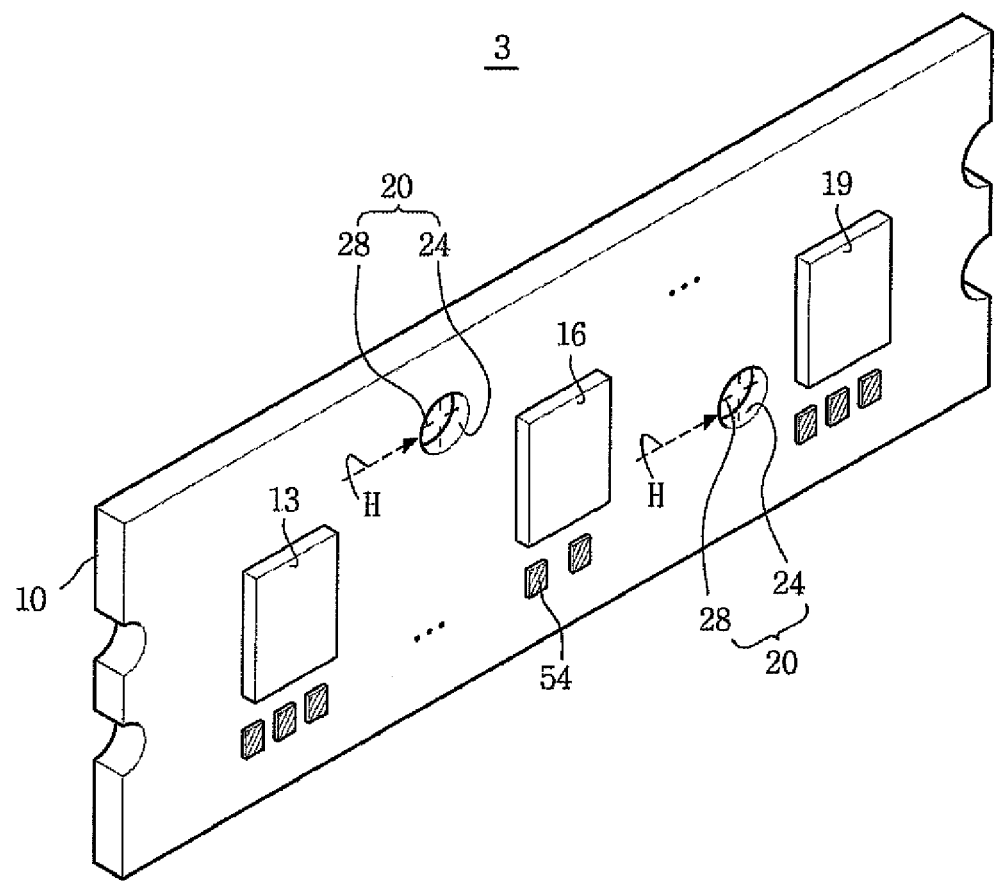
FIGS. 1 through 3 are perspective views showing a thermal-emitting memory module according to exemplary embodiments of the invention.

The invention will hereinafter be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed as a second element, component, region, layer or section without departing from the teachings of the present invention. As used herein, the term "and/or" includes any and all combinations of one or more of the associated listed items. Spatially relative terms, such as "over" "under", "upper" and the like, may be used herein for ease of description to describe one element or feature's relationship to another element(s) or feature(s) as shown in the figures. The terminology used herein is for the purpose of describing particular embodiments only and is not intended to limit example embodiments of the invention.

Figure 2:
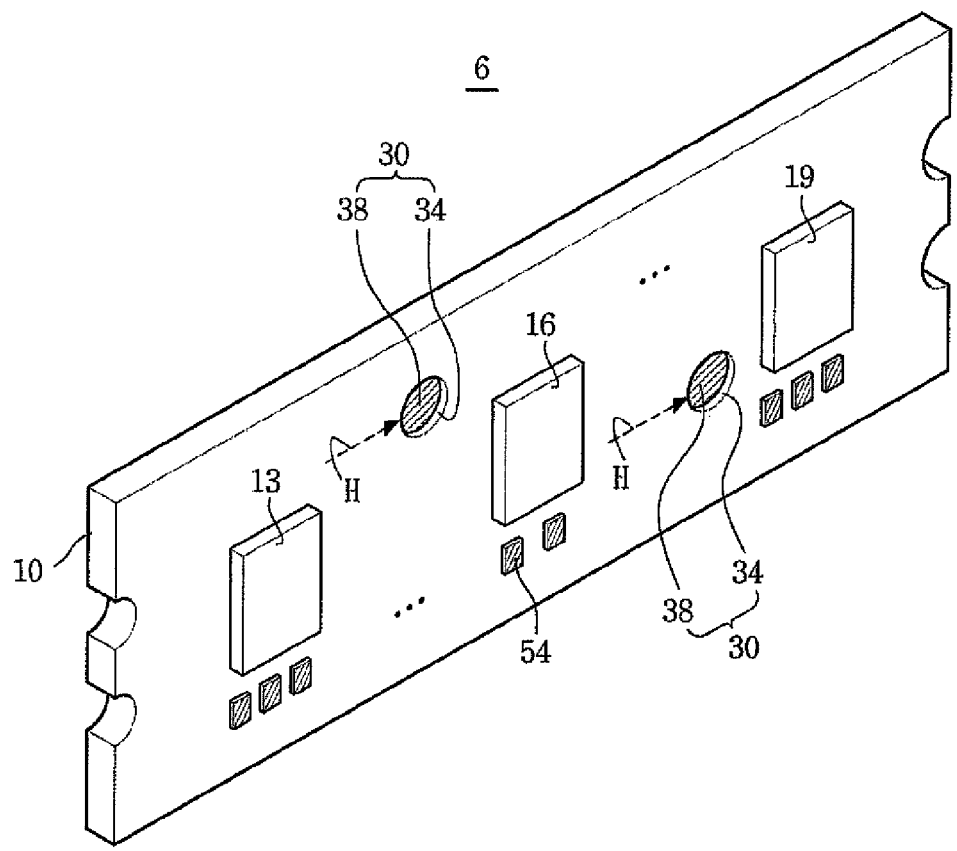
Figure 3:
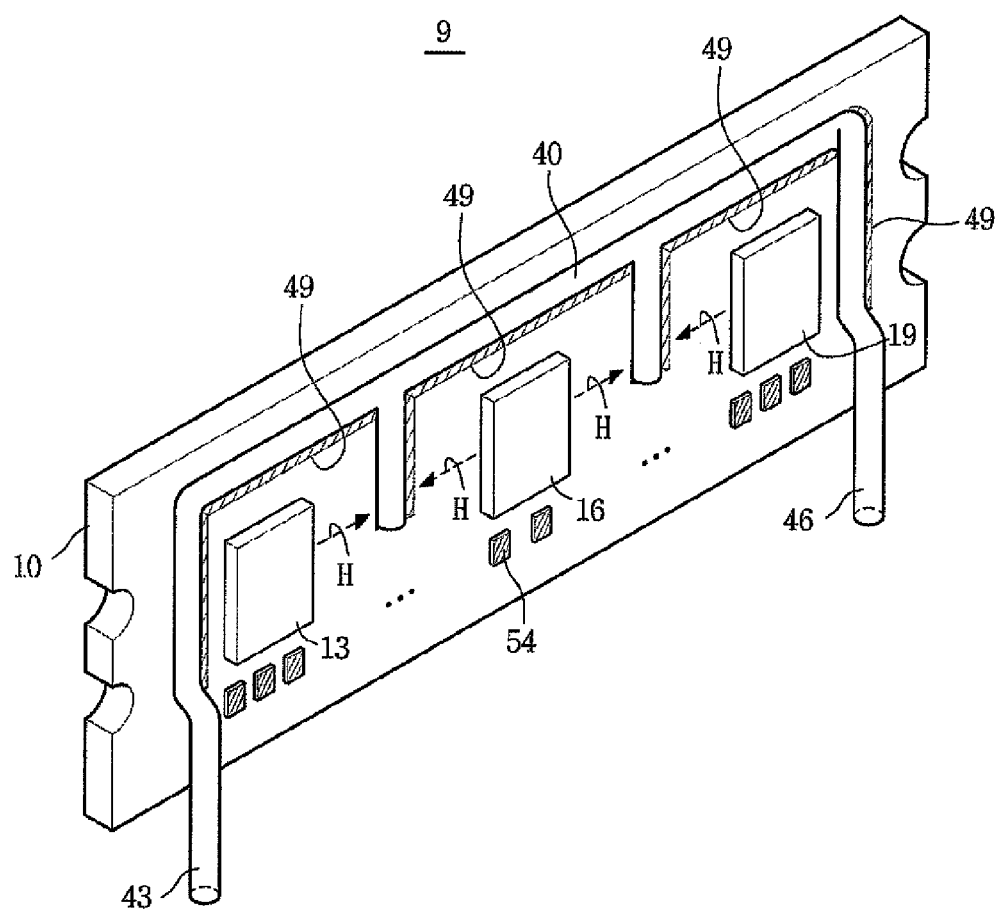

FIGS. 1 through 3 are perspective views showing a thermal-emitting memory module according to exemplary embodiments of the invention. In particular, FIGS. 1 through 3 illustrate thermal-emitting memory modules 3, 6 and 9, respectively. Each of the thermal-emitting memory modules 3, 6 and 9 may include a module substrate 10. The module substrate 10 may include electrically-conductive traces (not shown).

According to alternative embodiments of the invention, thermal-emitting portions 20, 30 and/or 49 may be disposed on the module substrate 10 as shown in FIGS. 1 through 3, respectively. In embodiments of the invention, the respective thermal-emitting portions 20, 30 and/or 49 may be disposed adjacent to an electrically-conductive trace. The thermal-emitting portions 20, 30 and 49 may collect heat (H) from a predetermined region of the module substrate 10 and may transfer the heat (H) away from the module substrate 10 via radiation or other heat-transfer methods.

The thermal-emitting portion 20 of the thermal-emitting memory module 3 may include a thermal-emitting hole 24 and a thermal-emitting body 28, as illustrated in FIG. 1. The thermal-emitting hole 24 may be disposed through the module substrate 10. The thermal-emitting body 28 may be placed in contact with a sidewall of the thermal-emitting hole 24. The thermal-emitting body 28 may be a thermally-conductive material, a thermally-insulating material, or combination thereof.

The thermal-emitting portion 30 of the thermal-emitting memory module 6 may include a thermal-emitting hole 34 and a thermal-emitting body 38, as depicted in FIG. 2. The thermal-emitting hole 34 may be disposed through the module substrate 10. The thermal-emitting body 38 may be disposed in the thermal-emitting hole 34 such that the thermal-emitting hole 34 is completely filled by the thermal-emitting body 38. The thermal-emitting body 38 may be a thermally-conductive material, a thermally-insulating material, or combination thereof.

The thermal-emitting memory module 9 may include a fluid pipe 40 disposed on the module substrate 10, as shown in FIG. 3. The fluid pipe 40 may be disposed on a peripheral region and/or a center region of the module substrate 10. The fluid pipe 40 may guide the flow of a fluid. Contacting portions 43 and 46 of the fluid pipe 40 may protrude outwardly from the module substrate 10. The thermal-emitting portion 49 may be disposed along the fluid pipe 40. The thermal-emitting portion 49 may be a thermally-conductive material, a thermally-insulating material, or combination thereof.

Referring again to FIGS. 1 through 3, semiconductor devices 13, 16 and 19 may be disposed on the module substrate 10 and coupled to the electrically-conductive traces (not shown) according to exemplary embodiments of the invention. The semiconductor devices 13, 16 and 19 may be disposed proximate to one or more of the thermal-emitting portions 20, 30 and/or 49. The semiconductor devices 13, 16 and/or 19 may be a volatile memory device, a non-volatile memory device, a passive device, an active device, or a combination thereof, according to application needs.

The volatile memory device may be or include, for example, a Dynamic Random Access Memory (DRAM) or a Static Random Access Memory (SRAM). The non-volatile memory device may be or include a Read Only Memory (ROM), a Magnetoresistive Random Access Memory (MRAM) or a Ferroelectric Random Access Memory (FeRAM). The passive device may be or include, for example, a resistor, a capacitor, or an inductor. The active device may be or include, for instance, a transistor or an amplifier.

Module pads 54 may be disposed on a selected peripheral region of a side of the module substrate 10, as shown in FIGS. 1 through 3. The module pads 54 may be electrically connected to the semiconductor devices 13, 16 and 19 through the electrically-conductive traces (not shown) and/or vias (not shown). The module pads 54 may be electrically-conductive material. Further, the module pads 54 and/or electrically-conductive traces (not shown) may be disposed on an opposite side (not shown) of the module substrate 10. Moreover, the electrically-conductive traces (not shown) may be included on one or more routing layers (not shown) of the substrate 10.

Next, a thermal-emitting module socket that is configured to mate with a thermal-emitting memory module will be described.

FIGS. 4 through 7 are perspective views showing a thermal-emitting module socket according to exemplary embodiments of the invention.

Figure 4:
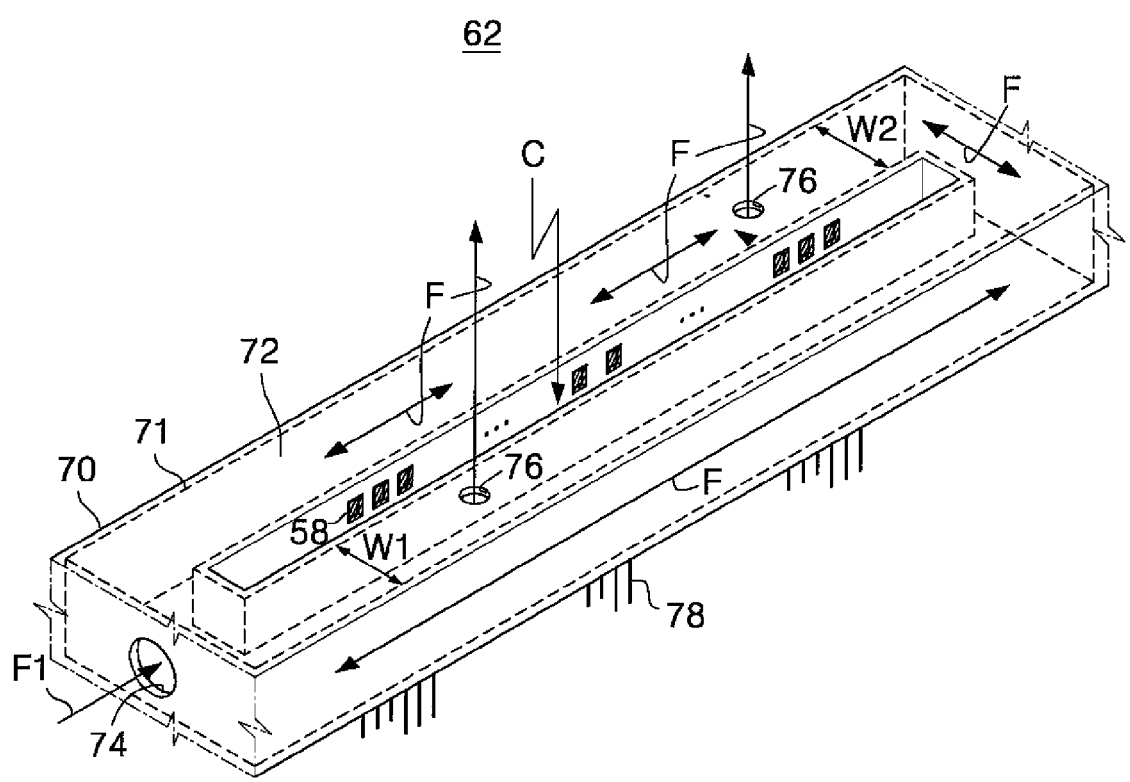
FIGS. 4 through 7 are perspective views showing a thermal-emitting module socket according to exemplary embodiments of the invention.

Referring to FIG. 4, a thermal-emitting module socket 62 may include a connecting portion (C) disposed in a center region and a socket body 70 having a fluid storing portion 71 disposed in a peripheral region surrounding the center region. The socket body 70 may be integrally formed with the fluid storing portion 71. The socket body 70 may have fluid-flowing gates exposing the fluid storing portion 71. The fluid-flowing gates may include a fluid-inflowing hole 74 and fluid-outflowing holes 76. The diameter of the fluid-inflowing hole 74 may be the same or different in comparison to the diameter of the fluid-outflowing holes 76.

The connecting portion (C) of the socket body 70 may include electrically-conductive traces (not shown) connected to socket pads 58. The socket pads 58 may correspond, for example, to the module pads 54 of the thermal-emitting memory modules 3 and 6. The socket pads 58 may be constructed of an electrically-conductive material and may be disposed, for example, on opposing interior sidewall faces of the connecting portion (C).

According to exemplary embodiments of the present invention, the socket body 70 may have a fluid storing portion 71 therein. The fluid storing portion 71 may have a fluid passageway 72. The fluid passageway 72 may be formed along a peripheral region in the socket body 70. Accordingly, the fluid passageway 72 is exposed to the fluid-inflowing hole 74 and the fluid-outflowing holes 76. As illustrated, the fluid-inflowing hole 74 may be disposed perpendicular to the fluid-outflowing holes 76 in the socket body 70. The fluid-outflowing holes 76 may be disposed to cooperate with the thermal-emitting portion 20 or 30 of the module substrate 10.

Figure 5:
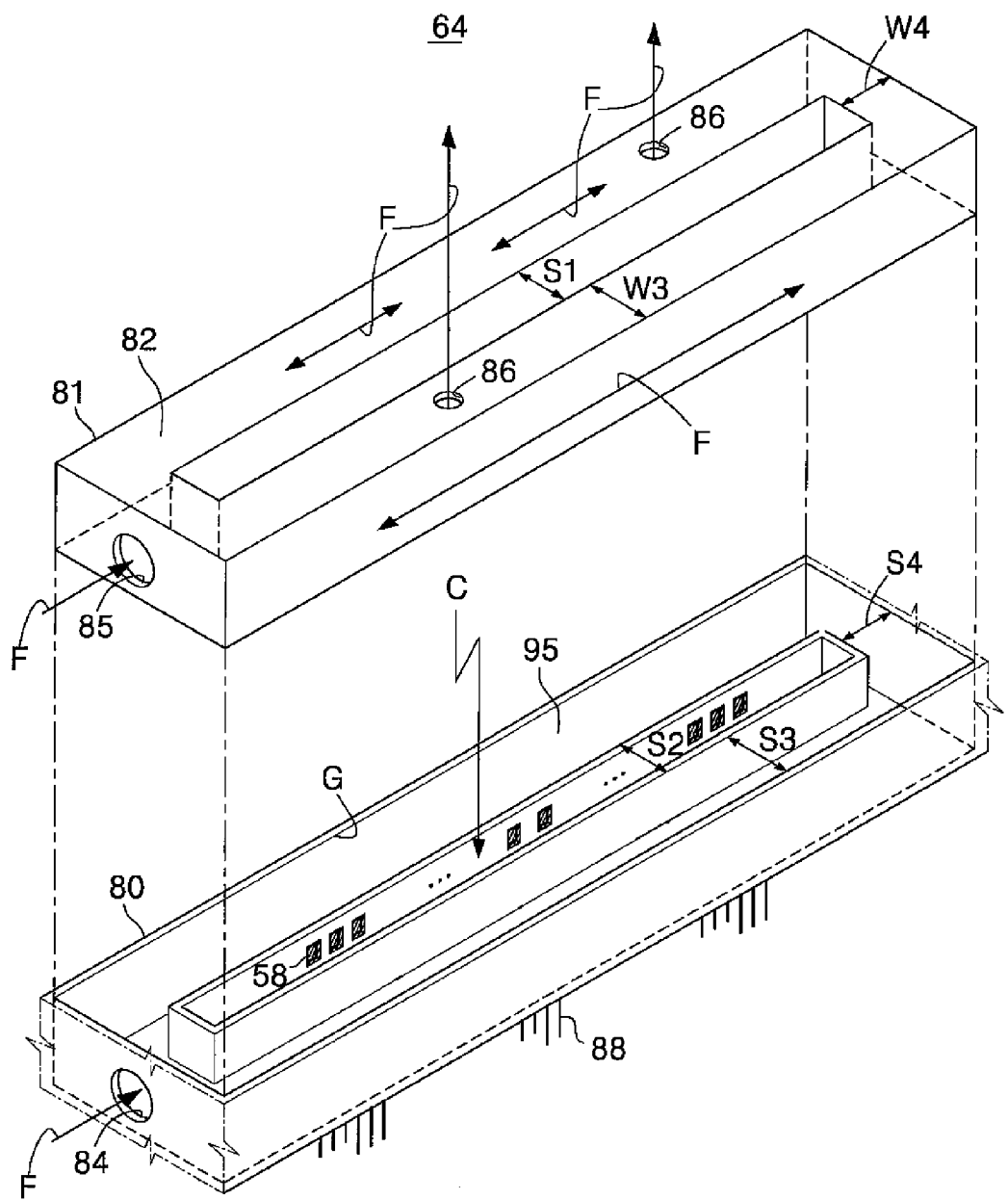

Referring to FIG. 5, a thermal-emitting module socket 64 may include a socket body 80 and a fluid storing portion 81. The socket body 80 and the fluid storing portion 81 may be separated from each other. The socket body 80 may have a connecting portion (C) disposed in a center region thereof, and a mount portion 95 formed in a peripheral region surrounding the center region. The mount portion 95 may have a groove (G) along a peripheral region thereof. When assembled, the fluid storing portion 81 may contact the socket body 80 along the grooves (G).

The socket body 80 and fluid storing portion 81 may include fluid-flowing gates. The socket body 80 may include an outer fluid-inflowing hole 84; the fluid storing portion 81 may include an inner fluid-inflowing hole 85, and fluid-outflowing holes 86. Diameters of the outer fluid-inflowing hole 84, inner fluid-inflowing hole 85 and fluid-outflowing holes 86 may be the same or different. The inner fluid-inflowing hole 85 may be disposed on a short side of the fluid storing portion 81. The fluid storing portion 81 may have a fluid passageway 82. The fluid passageway 82 may be exposed through the inner fluid-inflowing hole 85 and the fluid-outflowing holes 86. The inner fluid-inflowing hole 85 of the fluid storing portion 81 may be disposed to align with the outer fluid-inflowing hole 84 of the socket body 80. The fluid-outflowing holes 86 may be disposed to cooperate with the thermal-emitting portion 20 or 30 of the module substrate 10.

According to exemplary embodiments of the present invention, the connecting portion (C) of the socket body 80 may include electrically-conductive traces (not shown) connected to socket pads 58. The socket pads 58 may be disposed to cooperate with the module pads 54 of the respective first and second thermal-emitting memory modules 3 and 6. The socket pads 58 may be electrically-conductive material. The socket pads 58 may be disposed on inner opposing sidewalls of the connecting portion (C).

When the socket body 70 is integrally formed with the fluid storing portion 71 as shown in FIG. 4, the fluid may flow into the fluid storing portion 71 through the fluid-inflowing hole 74. Further, the fluid may flow out of the fluid-outflowing holes 76 after passing through the fluid passageway 72 along a fluid-flowing line (F). Portions of the fluid passageway 72 may have the same width or different widths (i.e., width W1 may or may not be equal to width W2).

When the socket body 80 is formed separately from the fluid storing portion 81, as shown in FIG. 5, the fluid may flow to into the fluid storing portion 81 through the outer fluid-inflowing hole 84 of the socket body 80 and the inner fluid-inflowing hole 85 of the fluid storing portion 81. Further, the fluid may flow out of the fluid-outflowing holes 86 after passing through the fluid passageway 82 along the fluid-flowing line (F). According to exemplary embodiments of the present invention, portions of the fluid passageway 82 may have the same or different widths (i.e. width W3 may or may not be equal to width W4).

With further reference to FIG. 5, a distance (S1) surrounded by the fluid passageway 82 is greater than a distance (S2) between outer sidewalls of the connecting portion (C). Further, the width (W3) of the fluid passageway 82 is less than a distance (S3) between an outer sidewall of the connecting portion (C) of the socket body 80 and an inner sidewall of the socket body 80. Likewise, the width (W4) of the fluid passageway 82 is less than a distance (S4) between an outer sidewall of the connecting portion (C) of the socket body 80 and an inner sidewall of the socket body 80. The socket body 80 may be formed of the same material or different materials as the fluid storing portion 81.

The electrically-conductive traces (not shown) of the connecting portion (C) in FIG. 4 may be electrically connected to system-connecting pins 78 through the socket pads 58. Similarly, the electrically-conductive traces (not shown) of the connecting portion (C) in FIG. 5 may be electrically connected to system-connecting pins 88 through the socket pads 58. The system-connecting pins 78 and 88 may be formed of electrically-conductive material.

According to a modified exemplary embodiment of the present invention, the fluid storing portion 71 in FIG. 4 may have the fluid passageway 72 disposed along a selected region in the socket body 70. In this instance, the fluid passageway 72 of the fluid storing portion 71 may be exposed to the fluid-inflowing hole 74 and the fluid-outflowing holes 76 in the selected region of the socket body 70. Likewise, the fluid storing portion 81 in FIG. 5 may have the fluid passageway 82 disposed along a selected area of the socket body 80. The fluid passageway 82 of the fluid storing portion 81 may be exposed to the outer fluid-inflowing hole 84 of the socket body 80 and the inner fluid-inflowing hole 85 and the fluid-outflowing holes 86 in the selected region of the fluid storing portion 81.

Figure 6:
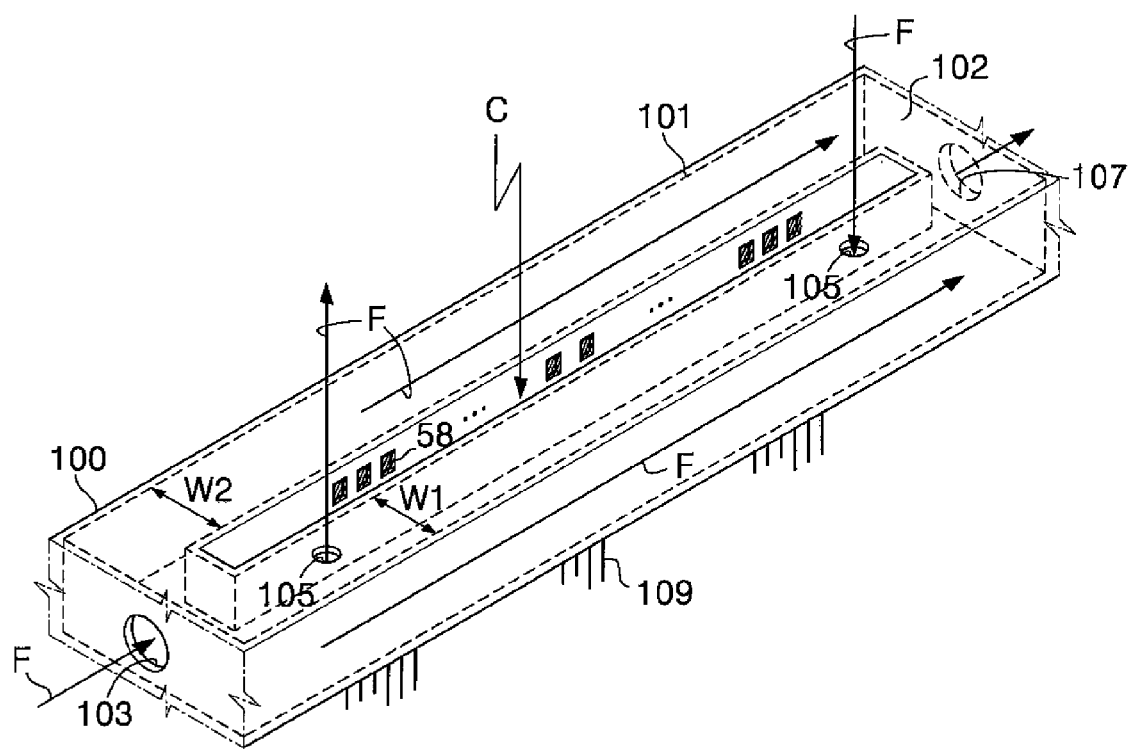

Referring to FIG. 6, a thermal-emitting module socket 66 may include a connecting portion (C) disposed in a center region thereof and a socket body 100 having a fluid storing portion 101 disposed in a peripheral region surrounding the center region. The socket body 100 may have fluid-flowing gates exposing the fluid storing portion 101. The fluid-flowing gates may include a fluid-inflowing hole 103, fluid-exhausting holes 105 and a fluid-outflowing hole 107. Diameters of the fluid-inflowing hole 103, fluid-exhausting holes 105 and fluid-outflowing hole 107 may be the same or different.

The connecting portion (C) of the socket body 100 may have electrically-conductive traces (not shown) that are electrically connected to socket pads 58. The socket pads 58 may be aligned, for example, with the module pads 54 of the third thermal-emitting memory module 9. The socket pads 58 may be disposed on an inner sidewall of the connecting portion (C). The socket pads 58 may also be disposed on inner opposing sidewalls of the connecting portion C.

The fluid storing portion 101 may have a fluid passageway 102 formed along a peripheral region in the socket body 100. Accordingly, the fluid passageway 102 is exposed to the fluid-inflowing hole 103, fluid-exhausting holes 105 and the fluid-outflowing hole 107. The fluid-inflowing hole 103 and the fluid-outflowing hole 107 may be disposed perpendicular to fluid-exhausting holes 105 in the socket body 100. The fluid-exhausting holes 105 may be in contact with the contacting portions 43 and 46 of the fluid pipe 40 shown in FIG. 3. The fluid-exhausting holes 105 may therefore be associated with the thermal-emitting portion 49 of the thermal-emitting memory module 9.

Figure 7:
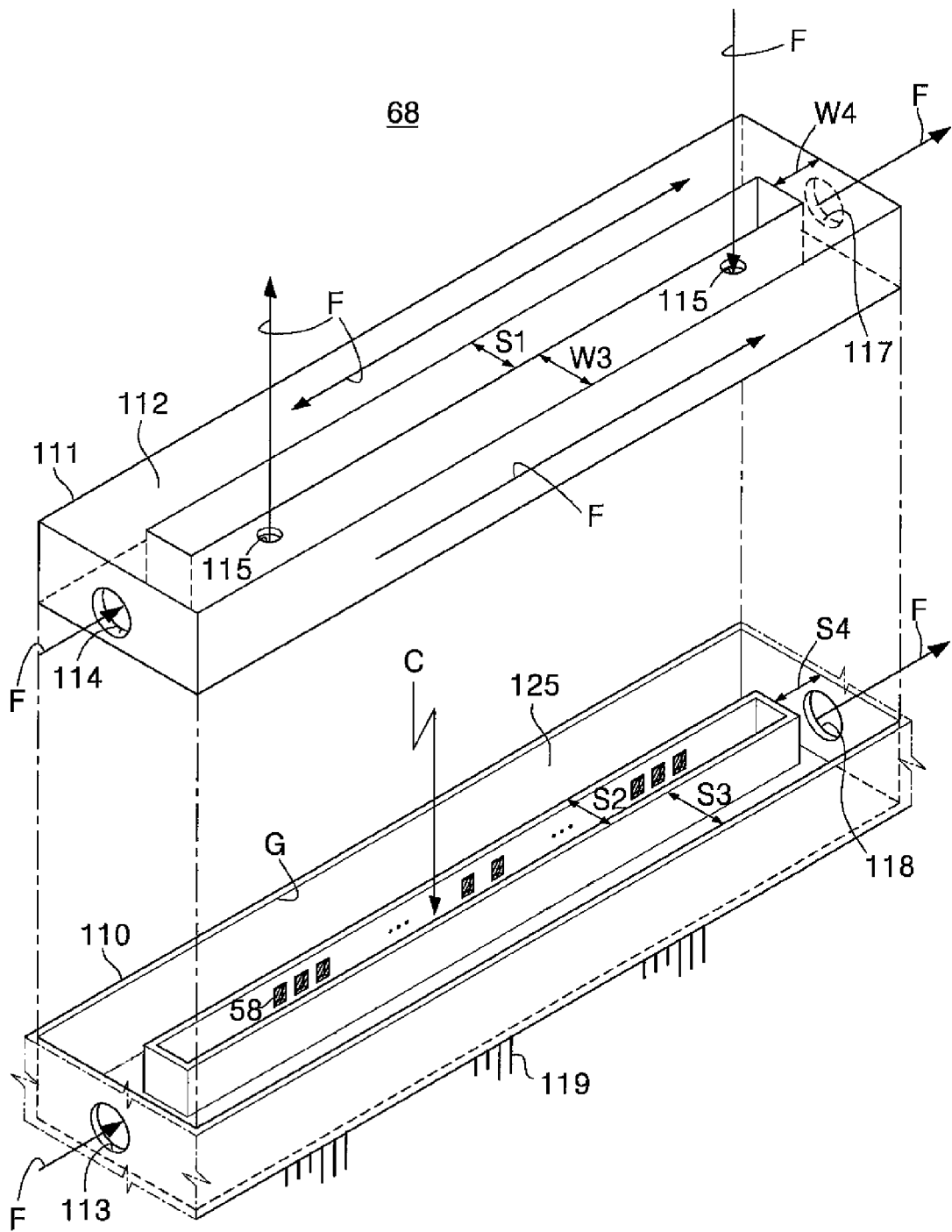

Referring to FIG. 7, a thermal-emitting module socket 68 may include a socket body 110 and a fluid storing portion 111. The socket body 110 and the fluid storing portion 111 may be separated from each other. The socket body 110 may have a connecting portion (C) disposed in a center region thereof, and a mount portion 125 formed along a peripheral region surrounding the center region. The mount portion 125 may have a Groove (G) along the peripheral region of the socket body 110. When assembled, the fluid storing portion 111 may be in contact with the socket body 110 along the Groove (G) so as to surround the connecting portion (C).

The socket body 110 and fluid storing portion 111 may have fluid-flowing gates. The fluid-flowing gates may include an outer fluid-inflowing hole 113, an inner fluid-inflowing hole 114, fluid-exhausting holes 115, an inner fluid-outflowing hole 117 and an outer fluid-outflowing hole 118. Diameters of the outer fluid-inflowing hole 113, the inner fluid-inflowing hole 114, the fluid-exhausting holes 115, the inner fluid-outflowing hole 117 and the outer fluid-outflowing hole 118 may be the same or different. The outer fluid-inflowing hole 113 and the outer fluid-outflowing hole 118 may be disposed in the socket body 110. The inner fluid-inflowing hole 114, the fluid-exhausting holes 115, and the inner fluid-outflowing hole 117 may be disposed in the fluid storing portion 111. Further, the inner fluid-inflowing hole 114 and the inner fluid-outflowing hole 117 may be disposed perpendicular to the fluid-exhausting holes 115.

The fluid storing portion 111 may have a fluid passageway 112. The fluid passageway 112 of the fluid storing portion 111 may be exposed to the inner fluid-inflowing hole 114, the fluid-exhausting holes 115 and the inner fluid-outflowing hole 117. The inner fluid-inflowing hole 114 and the inner fluid-outflowing hole 117 of the fluid storing portion 111 may be configured to align with the outer fluid-inflowing hole 113 and the outer fluid-outflowing hole 118, respectively, of the socket body 110. The fluid-exhausting holes 115 of the fluid storing portion 111 may be configured to contact the fluid pipe 40 through the contacting portions 43 and 46 in FIG. 3. The fluid-exhausting holes 115 of the fluid storing portion 111 may thus be associated with the thermal-emitting portion 49 of the thermal-emitting memory module 9.

The connecting portion (C) of the socket body 110 may include electrically-conductive traces (not shown) connected to, for example, the socket pads 58 of the thermal-emitting memory module 9. The socket pads 58 may be formed of electrically-conductive material. The socket pads 58 may be disposed on a sidewall of the connecting portion (C). Moreover, the socket pads 58 may be disposed on opposing inner sidewall faces of the connecting portion (C).

When the socket body 100 is integrally formed with the fluid storing portion 101 as shown in FIG. 6, the fluid may flow into the fluid storing portion 101 through the fluid-inflowing hole 103 of the socket body 100. Further, at least a portion of the fluid may be exhausted through at least one of the fluid-exhausting holes 105 after passing the fluid passageway 102 along a fluid-flowing line (F).

A remaining portion of fluid may exit via the fluid-outflowing hole 107. In the fluid passageway 102, width (W1) may or may not be equal to width (W2).

When the socket body 110 is formed separately from the fluid storing portion 111 as shown in FIG. 7, the fluid may flow into the fluid storing portion 111 through the outer fluid-inflowing hole 113, and into the inner fluid-inflowing hole 114 of the socket body 110. A portion of the fluid may be exhausted to at least one of the fluid-exhausting holes 115 after passing the fluid passageway 112 along the fluid-flowing line (F). Further, the remaining fluid may exit via the inner fluid-outflowing hole 117 and the outer fluid-outflowing hole 118 after passing the fluid passageway 112 of the fluid storing portion 111. In the fluid passageway 112, width (W3) may be the same or different than width (W4).

With further regard to FIG. 7, a distance (S1) surrounded by the fluid passageway 112 of the fluid storing portion 111 is greater in size than a distance (S2) between outer sidewalls of the connecting portion (C) of the socket body 110. Further, the width (W3 or W4) of the fluid passageway 112 of the fluid storing portion 111 is less than a distance (S3 or S4) between an outer sidewall of the connecting portion (C) and an inner sidewall of the socket body 110. The socket body 110 may be formed of the same material or different material as the fluid storing portion 111.

According to exemplary embodiments of the present invention, the electrically-conductive traces (not shown) of the connecting portion (C) in FIG. 6 may be electrically connected to system-connecting pins 109 through the socket pads 58. Likewise, the electrically-conductive traces (not shown) in the connecting portion (C) in FIG. 7 may be electrically connected to system-connecting pins 119 through the socket pads 58. The system-connecting pins 109 and 119 may be formed of electrically-conductive material.

According to a modified exemplary embodiment of the invention, the fluid storing portion 101 in FIG. 6 may have the fluid passageway 102 disposed along a selected region of the socket body 100. In this instance, the fluid passageway 102 of the fluid storing portion 101 may be exposed to the fluid-inflowing hole 103, the fluid-exhausting holes 105 and the fluid-outflowing hole 107. Similarly, the fluid storing portion 111 in FIG. 7 may have the fluid passageway 112 disposed along a selected region of the socket body 110. In this case, the fluid passageway 112 of the fluid storing portion 111 may be exposed to the outer fluid-inflowing hole 113 and outer fluid-outflowing hole 118 of the socket body 110. The fluid passageway 112 would also be exposed to the inner fluid-inflowing hole 114, the fluid-exhausting holes 115 and the inner fluid-outflowing hole 117 of the fluid storing portion 111.

Hereinafter, computer systems having a thermal-emitting memory module and a thermal-emitting module socket will be described.

Figure 8:
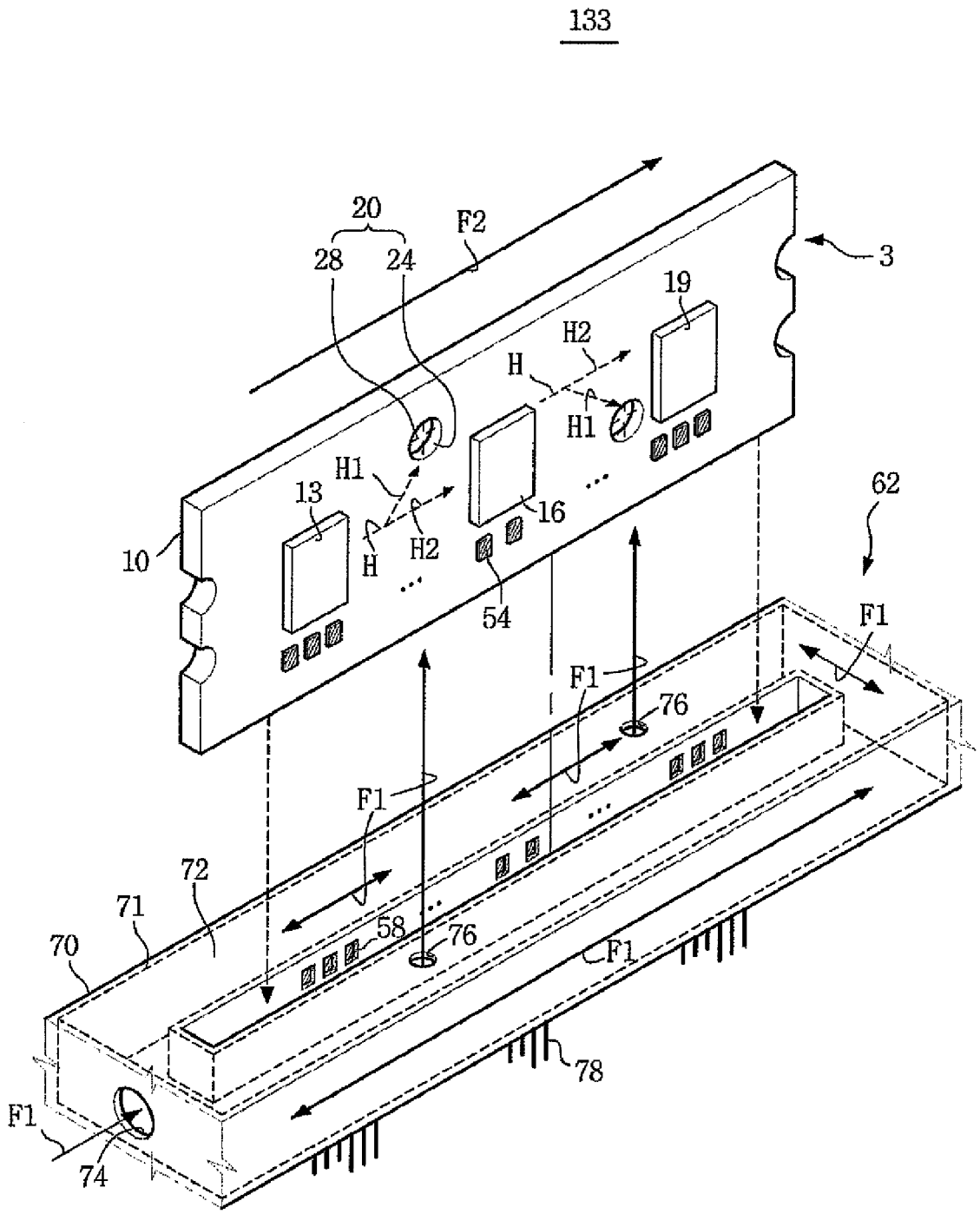
FIGS. 8 through 10 are perspective views showing a computer system having a thermal-emitting memory module and a thermal-emitting module socket according to exemplary embodiments of the invention.
Figure 9:
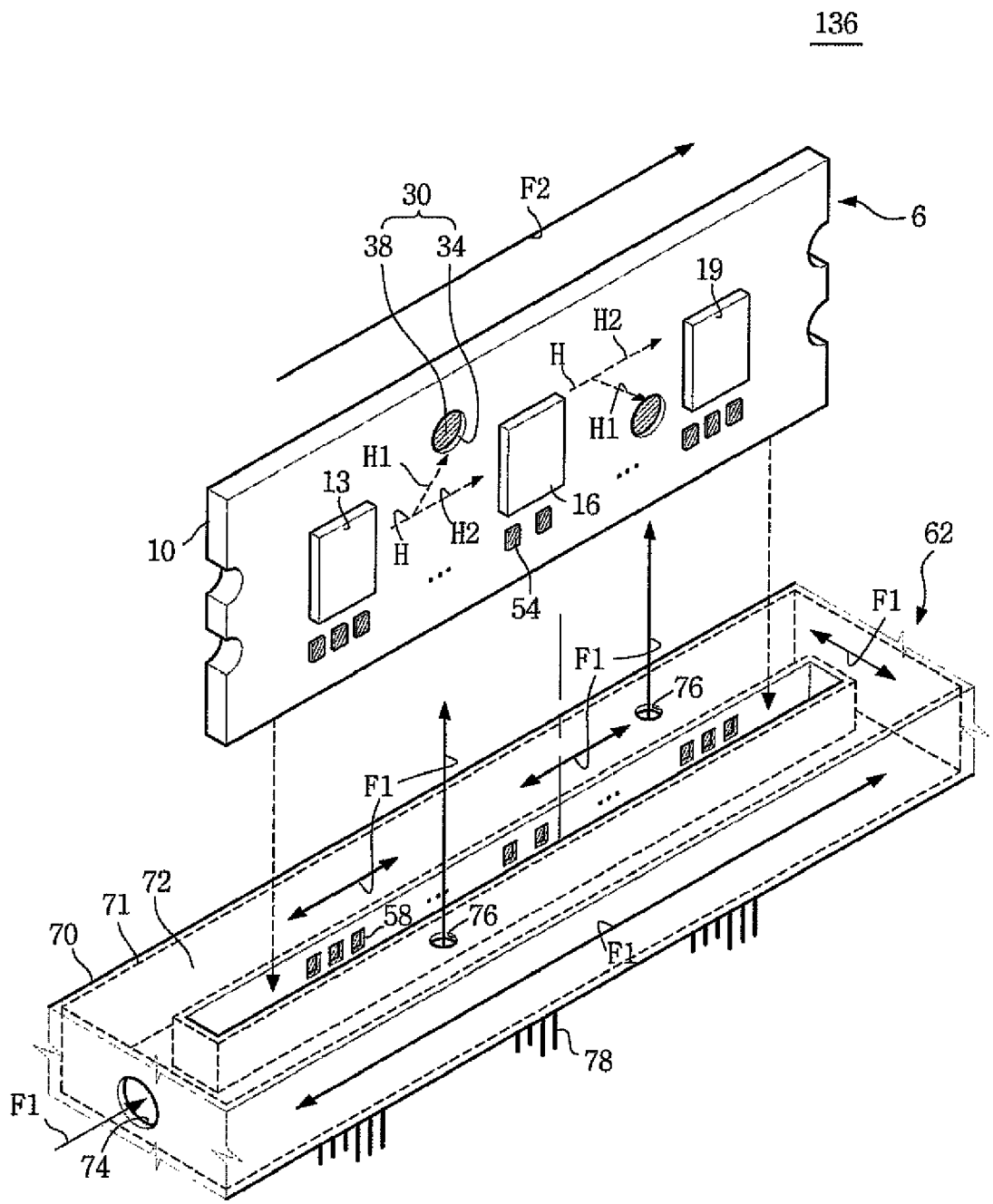
Figure 10:
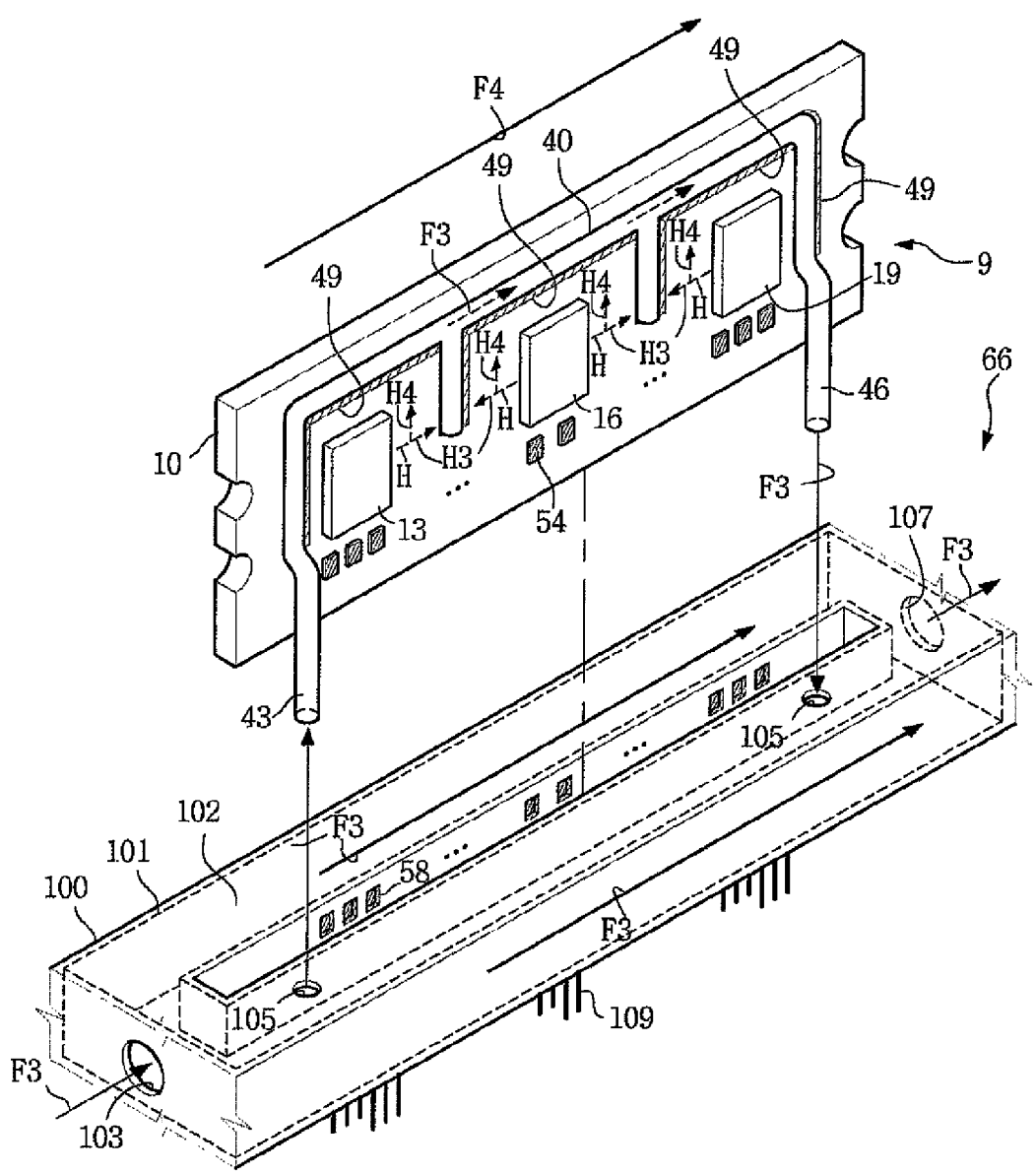

FIGS. 8 through 10 are perspective views showing computer systems having a thermal-emitting memory module and module socket, according to exemplary embodiments of the present invention.

As illustrated in FIG. 8, a computer system 133 may include the thermal-emitting memory module 3 and the thermal-emitting module socket 62. As illustrated in FIG. 9, a computer system 136 may include the thermal-emitting memory module 6 the thermal-emitting module socket 62.

The respective first and second thermal-emitting memory modules 3 and 6 may electrically connect to the thermal-emitting module socket 62. More specifically, the module pads 54 may be in contact with the socket pads 58. As such, the electrically-conductive traces (not shown) in the thermal-emitting memory modules 3 and 6 may be electrically connected to electrically-conductive traces (not shown) in the thermal-emitting module socket 62.

As shown in FIG. 8, the thermal-emitting portion 20 may be perpendicularly disposed over the fluid-outflowing holes 76. Likewise, as shown in FIG. 9, the thermal-emitting portion 30 may be perpendicularly disposed over the fluid-outflowing holes 76.

With reference to FIG. 9, the fluid-outflowing holes 76 may be disposed around the thermal-emitting memory module 6 along the fluid passageway 72 of the socket body 70. Accordingly, the fluid-outflowing holes 76 may be the same in number as the thermal-emitting portions 30 of the thermal-emitting memory module 6.

Meanwhile, a different computer system (not shown) may be formed using the thermal-emitting memory module 3 and the thermal-emitting module socket 64. In this instance, the fluid-outflowing holes 86 of the fluid storing portion 81 may cooperate with the thermal-emitting portion 20 of the thermal-emitting memory module 3.

Alternatively, yet another computer system (not shown) could be provided using the thermal-emitting memory module 6 and the thermal-emitting module socket 64. In such a case, the fluid-outflowing holes 86 in the second thermal-emitting module socket 64 may be configured to cooperate with the thermal-emitting portion 30 of the thermal-emitting memory module 6.

According to a modified exemplary embodiment of the invention, the fluid storing portion 71 in FIG. 4 may have a fluid passageway 72 along only a selected portion of the socket body 70. The fluid passageway 72 of the fluid storing portion 71 may be exposed to the fluid-inflowing hole 74 and fluid-outflowing holes 76. Such a version of the thermal-emitting module socket 62 could be used together with the thermal-emitting memory module 3 to form yet another computer system (not shown). Similarly, such a version of the thermal-emitting module socket 62 could be used together with the memory module 6 to form a computer system (not shown).

Further, thermal-emitting module socket 64 could be used together with the memory module 3 and/or the memory module 6 to form other computer system variants (not shown).

FIG. 10 illustrates a computer system 139 that includes the thermal-emitting memory module 9 coupled to the thermal-emitting module socket 66.

The module pads 54 of the thermal-emitting memory module 9 may be in contact with the socket pads 58 of the thermal-emitting module socket 66. As such, electrically-conductive traces (not shown) in the thermal-emitting memory module 9 may be electrically connected to electrically-conductive traces (not shown) in the thermal-emitting module socket 66 through the module pads 54 and the socket pads 58. Additionally, the fluid pipe 40 of the thermal-emitting memory module 9 may be in contact with the fluid-exhausting holes 105 of the thermal-emitting module socket 66. As such, the thermal-emitting portion 49 of the thermal-emitting memory module 9 may be disposed to cooperate with the fluid-exhausting holes 105 of the thermal-emitting module socket 66.

In an alternative embodiment (not shown), a computer system includes the thermal-emitting memory module 9 and the thermal-emitting module socket 68. In this case, the module pads 54 are connected to the socket pads 58. The fluid-exhausting holes 115 of the fluid storing portion 111 are coupled to the fluid pipe 40 of the thermal-emitting memory module 9.

According to a modified exemplary embodiment of the present invention, the fluid storing portion 101 in the thermal-emitting module socket 66 may have the fluid passageway 102 along only a selected region of the socket body 100. The fluid passageway 102 may be exposed to the fluid-inflowing hole 103, the fluid-exhausting holes 105 and the fluid-outflowing hole 107. Such a modified thermal-emitting module socket 66 may be combined with the thermal-emitting memory module 9 to form an alternative computer system (not shown).

Likewise, the fluid storing portion 111 in the thermal-emitting module socket 68 may have a fluid passageway 112 along only a selected region in the socket body 110. The fluid passageway 112 of the fluid storing portion 111 may be exposed to the outer fluid-inflowing hole 113 and the outer fluid-outflowing hole 118 of the socket body 110, the inner flow-inflowing hole 114, the fluid-exhausting holes 115 and the inner fluid-outflowing hole 117 of the fluid storing portion 111. Such a modified thermal-emitting socket 68 may be combined with the thermal-emitting memory module 9 for form yet another computer system variant (not shown).

Hereinafter, a higher-level system and operation of the above-described computer systems will be described.

The computer systems 133, 136, or any of the above-described variants of computer systems 133 and 136, may be assembled into a system body (not shown). The system body may further include hardware (not shown) and a fluid-flowing generator (not shown). The hardware may include, for example, a central processing unit (CPU) and an input/output (I/O) unit. The fluid-flowing generator may be configured to provide fluid. The fluid may be material in gas state and/or may have a temperature that is lower than typical room temperature. The computer system 133, 136, or any of the above-described variants may electrically connect to the CPU and/or I/O unit via the system-connecting pins 78. The computer system 133, 136, or any of the above-described variants may couple to the fluid-flowing generator via the fluid-inflowing hole 74.

In operation, heat may be generated in the semiconductor devices 13, 16 and/or 19 and transferred to the module substrate 10. A portion of the heat (H1) may move between the semiconductor devices 13, 16 and 19. The remaining heat (H2) may move from the semiconductor devices 13, 16 and 19 toward the thermal-emitting portion 20 or 30. The fluid-flowing generator outputs fluid to the fluid-inflowing hole 74 of the socket body 70. The fluid may flow along the fluid-flowing line (F1) in the fluid storing portion 71. Subsequently, projection pressure of the fluid may be formed at the fluid-outflowing holes 76. The fluid may thus be projected from the fluid-outflowing holes 76 of the socket body 70 toward the thermal-emitting portion 20 or 30 of the first or second thermal-emitting memory module 3 or 6. The fluid may thus cool the thermal-emitting portion 20 or 30. Furthermore, the fluid may cool other portions of the module substrate 10 and the semiconductor devices 13, 16 and 19 along another fluid-flowing line (F2).

The operation is substantially similar for variants of computer systems 133 and 136 that include the thermal-emitting module socket 64.

The computer system 139, or any of the above-described variants of the computer system 139, may be assembled into a system body (not shown). The system body may further include hardware (not shown) and a fluid-flowing generator (not shown). The hardware may include, for example, a central processing unit (CPU) and an input/output (I/O) unit. The fluid-flowing generator may be configured to provide fluid. The fluid may be material in gas state and/or may have a temperature that is lower than typical room temperature. The computer system 139, or any of the above-described variants, may electrically connect to the CPU and/or I/O unit via the system-connecting pins 109. The computer system 139, or any of the above-described variants, may couple to the fluid-flowing generator via the fluid-inflowing hole 103.

In operation, heat may be generated in the semiconductor devices 13, 16 and/or 19 and transferred to the module substrate 10. A portion of the heat (H3) may propagate horizontally between the semiconductor devices 13, 16 and 19 toward the fluid pipe 40. The remaining heat (H4) may move vertically from the semiconductor devices 13, 16 and 19 toward the fluid pipe 40. The fluid-flowing generator outputs fluid into the fluid-inflowing hole 103 of the socket body 100. The fluid may flow along the fluid-flowing line (F3) in the fluid storing portion 102. Subsequently, projection pressure of the fluid may be formed at a fluid-outflowing hole 105. At least a portion of the fluid may thus be projected from a first fluid-outflowing hole 105, through the fluid pipe 40, into the second fluid-outflowing hole 105, and out of the fluid-outflowing hole 107 along fluid-flowing line (F3). The fluid may thus cool the thermal-emitting portion 49 of the substrate 10. Furthermore, the fluid may cool other portions of the module substrate 10 and the semiconductor devices 13, 16 and 19 along another fluid-flowing line (F4).

The operation is substantially similar for variants of computer system 139 that include the thermal-emitting module socket 68.

As described above, embodiments of the invention may improve operation of a computer system by dissipating heat that is generated on the module substrate 10 during operation. The principles of the invention are not limited to a computer system, however. For example, the invention may be applicable to telecommunication appliances, user interface devices, audio systems, or other electronic appliances that could benefit from the thermal management components, systems, and techniques described herein.

Although the present invention has been described with reference to certain exemplary embodiments thereof, it will be understood by those skilled in the art that a variety of modifications and variations may be made to the present invention without departing from the spirit or scope of the invention as defined in the appended claims, and their equivalents. For example, features described with respect to the embodiments described above could be utilized in combinations not expressly disclosed.

What is claimed is:

1. A thermal-emitting module comprising:
   a module substrate having electrically-conductive traces; and
   a semiconductor device disposed on the module substrate and coupled to the electrically-conductive traces, the module substrate including a thermal-emitting portion disposed in proximity of the semiconductor device without directly contacting the semiconductor device, wherein the thermal-emitting portion includes:
   a thermal-emitting hole passing through the module substrate; and
   a thermal-emitting body disposed in the thermal-emitting hole and protruding inwardly from a sidewall of the thermal-emitting hole, the thermal-emitting body including at least one of a thermally-conductive material and a thermally-insulating material.

2. The thermal-emitting module of claim 1, wherein the thermal-emitting body completely fills the thermal-emitting hole.

3. The thermal-emitting module of claim 1, wherein the thermal-emitting body partially fills the thermal-emitting hole.

4. The thermal-emitting module of claim 1, further comprising a fluid pipe disposed on the module substrate, the thermal-emitting portion being disposed along the fluid pipe, the fluid pipe configured to guide a fluid flow.

5. The thermal-emitting module of claim 1, wherein the semiconductor device includes at least one of a volatile memory device, a non-volatile memory device, a passive device, and an active device.

6. A thermal-emitting module socket configured to couple to a thermal-emitting module, the thermal-emitting module socket comprising a socket body, the socket body including:
   a connecting portion disposed in a center region of the socket body; and
   a fluid storing portion disposed in a peripheral region surrounding the center region, wherein
   the socket body includes a plurality of openings to an interior of the fluid storing portion.

7. The thermal-emitting module socket of claim 6, wherein the connecting portion includes a plurality of electrically-conductive pads configured to couple to corresponding electrically-conductive pads on the thermal-emitting module.

8. The thermal-emitting module socket of claim 6, wherein the fluid storing portion is integrally formed with the socket body.

9. The thermal-emitting module socket of claim 6, wherein the fluid storing portion is a separate component of the socket body.

10. The thermal-emitting module socket of claim 6, wherein the plurality of openings includes:
    an input port configured to receive a fluid into the fluid storing portion; and
    at least one output port configured to expel at least a portion of the fluid out of the fluid storing portion such that the portion of the fluid contacts the thermal-emitting module.

11. The thermal-emitting module socket of claim 6, wherein the plurality of openings includes:
    a first input port configured to receive a fluid into the fluid storing portion;
    a first output port configured to expel at least one portion of the fluid out of the fluid storing portion to a fluid pipe, the fluid pipe being a component of the thermal-emitting module;

a second input port configured to receive the at least one portion of the fluid from the fluid pipe; and a second output port configured to expel the fluid from the fluid storing portion to other than the fluid pipe.

12. A computer system comprising:
a thermal-emitting module including:
   a module substrate having electrically-conductive traces; and
   a semiconductor device disposed on the module substrate and coupled to the electrically-conductive traces, the module substrate including a thermal-emitting portion disposed in proximity of the semiconductor device without directly contacting the semiconductor device; and
a thermal-emitting module socket coupled to the thermal-emitting module, the thermal-emitting module socket including a socket body, the socket body having:
   a connecting portion; and
   a fluid storing portion, the socket body having a plurality of openings to an interior of the fluid storing portion.

13. The computer system of claim 12 wherein the thermal-emitting portion includes:
   a thermal-emitting hole; and
   a thermal-emitting body, the thermal-emitting hole passing through the module substrate, the thermal-emitting body being disposed in the thermal-emitting hole and protruding inwardly from a sidewall of the thermal-emitting hole, the thermal-emitting body including at least one of a thermally-conductive material and a thermally-insulating material.

14. The computer system of claim 13 wherein the plurality of openings includes:
   an input port configured to receive a fluid into the fluid storing portion; and
   at least one output port configured to expel at least a portion of the fluid out of the fluid storing portion such that the portion of the fluid contacts the thermal-emitting body.

15. The computer system of claim 12 further comprising a fluid pipe disposed on the module substrate, the thermal-emitting portion being disposed along the fluid pipe, the fluid pipe configured to guide a fluid flow.

16. The computer system of claim 15 wherein the plurality of openings includes:
   a first input port configured to receive a fluid into the fluid storing portion; and
   a first output port configured to expel at least one portion of the fluid out of the fluid storing portion to the fluid pipe;
   a second input port configured to receive the at least one portion of the fluid from the fluid pipe; and
   a second output port configured to expel the fluid from the fluid storing portion to other than the fluid pipe.

* * * * *